United States Patent
Stevens et al.

(10) Patent No.: US 7,102,220 B2
(45) Date of Patent: Sep. 5, 2006

(54) MULTIPLE CAVITY/COMPARTMENT PACKAGE

(75) Inventors: Daniel S Stevens, Stratham, NH (US); Jeffrey T Mink, Merrimack, NH (US)

(73) Assignee: Delaware Capital Formation, Inc., Wilmington, DE (US)

( * ) Notice: Subject to any disclaimer, the term of this patent is extended or adjusted under 35 U.S.C. 154(b) by 0 days.

(21) Appl. No.: 10/922,187

(22) Filed: Aug. 19, 2004

(65) Prior Publication Data

US 2005/0051884 A1    Mar. 10, 2005

Related U.S. Application Data

(60) Provisional application No. 60/496,169, filed on Aug. 19, 2003.

(51) Int. Cl.
*H01L 23/02*    (2006.01)

(52) U.S. Cl. ................................ 257/686; 257/724

(58) Field of Classification Search ............... 257/685, 257/686, 690, 723, 724; 174/52.4
See application file for complete search history.

(56) References Cited

U.S. PATENT DOCUMENTS

| | | |
|---|---|---|
| 4,627,533 A | 12/1986 | Pollard |
| 4,750,246 A | 6/1988 | Pollard |
| 4,903,120 A | 2/1990 | Beene et al. |
| 4,943,844 A | 7/1990 | Oscilowski et al. |
| 4,985,687 A | 1/1991 | Long |
| 5,012,386 A | 4/1991 | McShane et al. |
| 5,405,476 A | 4/1995 | Knecht |
| 5,500,628 A | 3/1996 | Knecht |
| 5,633,530 A * | 5/1997 | Hsu ........................... 257/685 |
| 5,729,181 A | 3/1998 | Cutler et al. |
| 5,771,556 A | 6/1998 | Allen et al. |
| 5,917,272 A | 6/1999 | Clark et al. |
| 6,133,674 A | 10/2000 | Fry |
| 6,333,856 B1 * | 12/2001 | Harju ........................ 361/761 |
| 6,518,659 B1 | 2/2003 | Glenn |
| 6,731,180 B1 | 5/2004 | Clark et al. |
| 2005/0051884 A1 * | 3/2005 | Stevens et al. ............. 257/686 |

* cited by examiner

*Primary Examiner*—Mark V. Prenty
(74) *Attorney, Agent, or Firm*—Maine & Asmus

(57) ABSTRACT

A package assembly for electronic components that allows for low-cost multiple cavities as well as a multiple compartment structure that allows more components in a smaller package size. In one embodiment the present invention is a multi-cavity package having at least one substrate forming at least one cavity with the substrate coupled to a shelf within the sidewalls of the package.

20 Claims, 8 Drawing Sheets

MULTIPLE CAVITY/COMPARTMENT PACKAGE

RELATED APPLICATIONS

This application claims the benefit of U.S. Provisional Applications No. 60/496,169 filed Aug. 19, 2003, and this application is hereby incorporated in its entirety by reference.

FIELD OF THE INVENTION

This invention relates to packages for electronic components, and more particularly to a multiple cavity structure for packaging such devices.

BACKGROUND OF THE INVENTION

Miniaturization of electronic components has been an on-going trend in the electronics industry. The consuming public demands more processing and capabilities in smaller and smaller packages. While many electronic functions can be transistorized, certain electronic functions, such as frequency control devices, present packaging challenges. This challenge is further complicated when certain components require isolation from other components in the same package.

For example, crystal resonators are used for providing highly precise frequency references for many applications. Piezoelectric quartz crystal resonators are commonly implemented in such oscillators to provide highly accurate timing signals for communications, navigation and radar applications. The piezoelectric devices, such as piezoelectric quartz filters, piezoelectric quartz resonators and the like, typically include a piece of piezoelectric material mounted to a substrate. The quartz element can have thin metallic electrodes attached to it through which electrical signals are coupled into and out of the piezoelectric quartz material. Common problems with piezoelectric devices are adequately isolating the piezoelectric device from mechanical shock and dealing with thermal expansion coefficient mismatches between the piezoelectric material and the substrate material.

There have been attempts to alleviate some of the problems described herein that have had only limited success. A dual cavity package has been implemented in the AT&T TRU-200 package. In addition, the 'H-package' is described in U.S. Pat. Nos. 5,500,628 and 5,405,476. The H-package uses thick film technology and has a hermetic bottom cavity on one side that is disposed to have the additional non-hermetic cavity. There are several references that illustrate some form of package shelves, namely the chip carrier of U.S. Pat. No. 4,903,120 and the high density package of U.S. Pat. No. 4,943,844. Stackable packages are described in U.S. Pat. No 6,518,659. Multiple chamber or cavity packages of some form are depicted in U.S. Pat. Nos. 4,985,687; 4,627,533; and 5,729,181. Other references include U.S. Pat. Nos. 5,771,556 and 6,133,674.

The state of the art suffers from the problem of how to incorporate the individual components of a larger package into a smaller package. One possible solution is a package design that suspends a substrate to a package by mounting on shelves. Such a design can employ the thick film as well as thin film or flex circuit technology and allow high performance components such as inductors, capacitors, and varactors to be incorporated.

BRIEF SUMMARY OF THE INVENTION

The present invention has been made in consideration of the aforementioned background. One aspect of the present invention is to provide a package assembly that allows for a low-cost multiple cavities and compartment structure that encompasses more components in a smaller package size.

In one embodiment the invention is a multiple cavity structure, comprising a package housing comprising a package floor and package sides. The package sides extend about the package floor, wherein the package sides form a first shelf extending about a periphery of an inner surface of the package sides. There is a planar substrate coupled to the shelf forming a first cavity between the package floor and the substrate, wherein the substrate has at least one substrate component on at least one surface of the substrate; and a covering on the package housing, wherein the covering forms a second cavity between the covering and the substrate.

There are many variations to the present invention. For example, the package housing can be ceramic, and the substrate can be selected from at least one of the group of materials consisting of: thick film, thin film, and flex film. And, the substrate can be secured to the shelf by a conductive substrate attach material.

The structure can further comprise vias proximate the shelf and electrically coupling the substrate. The substrate components and package component could be electrically coupled by at least one electrical coupler from the group consisting of: wire bonds, vias, through-holes, and traces.

Further embodiments include wherein the covering is a lid adhered to a rim of the package sides. The covering can also be a glob top filler.

The flexibility in the design allows for the first cavity to be hermetic, the second cavity to be hermetic, or both cavities can be hermetic. The structure can further comprise at least one package component mounted to a surface selected from the group consisting of: package floor, interior lid surface, and side walls.

An additional embodiment of the invention is a multiple compartment, multiple cavity package, comprising a package housing forming an open-top enclosure comprising, a package floor and package sides about the package floor, wherein the package sides form a first shelf extending about a periphery of an inner surface of the package sides. The first planar substrate is coupled about the first shelf and forms a first cavity between the package floor and the first substrate. And, at least one inner wall approximately orthogonal to the package floor is coupled to the package sides and to the substrate, wherein the at least one inner wall forms at least two compartments in the in the first cavity. The inner wall can even be a drop-in.

The package may further comprise at least one component coupled on at least once surface of the substrate, wherein the component is monolithically integrated.

The package can also have a second shelf formed about the periphery of the inner surface of the package sides and being approximately parallel to the first shelf and disposed between the covering and the first shelf. A second substrate is coupled to the second shelf forming a third cavity between the exposed top portion and the second substrate, wherein the second cavity is disposed between the first and second substrate.

Yet a further embodiment is a component package assembly, comprising a package housing forming an open-top enclosure comprising, a package floor and package sides disposed about the package floor. There is a planar substrate suspended within the enclosure forming a first cavity between the package floor and the substrate, wherein the substrate has at least one substrate component on at least one surface of the substrate; and a covering on the package housing, wherein the covering forms a second cavity between the covering and the substrate. The substrate can be suspended by at least one of the structures selected from the group consisting of: clips, posts, pedestals, and shelf sections. There can even be a tapered wall about the second cavity providing self-alignment.

In addition, a second assembly can be coupled to the first assembly, commonly known as stacking.

Still other objects and advantages of the present invention will become readily apparent to those skilled in this art from the following detailed description, wherein we have shown and described only a preferred embodiment of the invention, simply by way of illustration of the best mode contemplated by us on carrying out the invention. As will be realized, the invention is capable of other and different embodiments, and its several details are capable of modifications in various obvious respects, all without departing from the invention.

BRIEF DESCRIPTION OF THE DRAWINGS

The present invention will be readily understood by the following detailed description in conjunction with the accompanying drawings, wherein like reference numerals designate like structural elements.

DETAILED DESCRIPTIONS OF THE INVENTION

Figure 1:
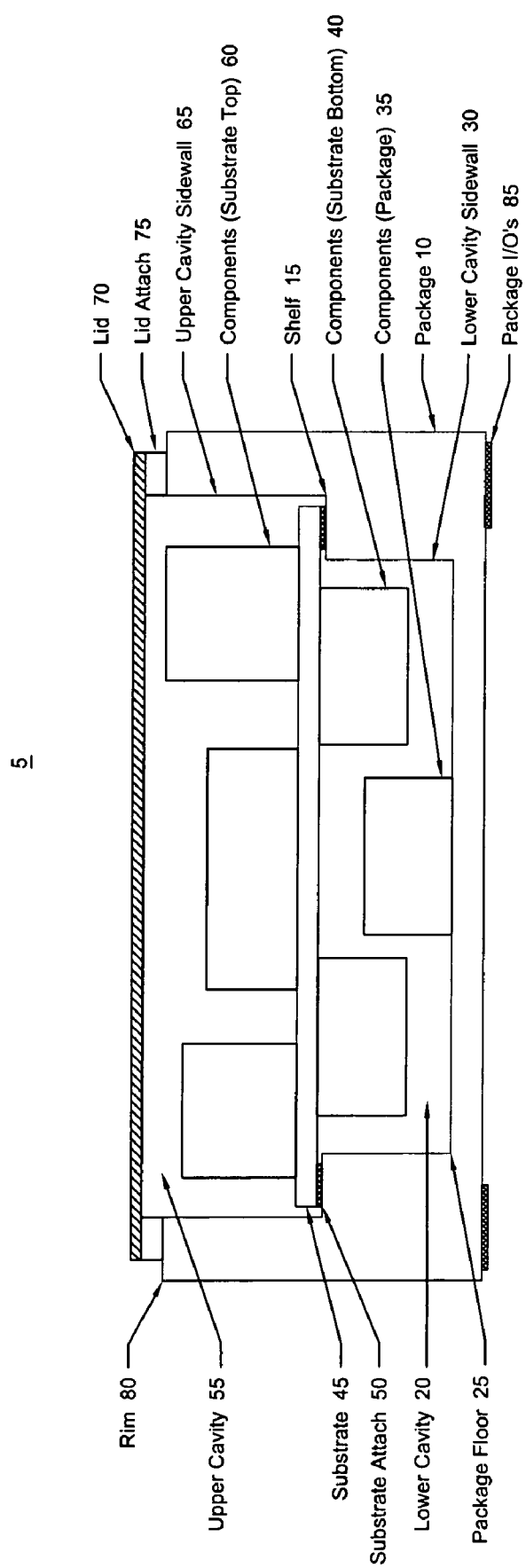
FIG. 1 a side view perspective of dual hermetic cavities separated by the substrate with illustrative components wherein the substrate rests upon a package shelf forming a first hermetic cavity and a lid is attached to form the second hermetic cavity.

Referring to FIG. 1, one embodiment for a dual cavity tiered package assembly 5 is depicted. The package 10 is configured to have a shelf structure 15 formed about the interior of the package. The lower cavity 20 is defined by the package floor 25, lower cavity side walls 30 and a substrate layer 45 acting as the 'roof' of the lower cavity 20.

Lower cavity package components 35 can be attached by solder, gold, gold-gold interface (e.g. thermosonic gold ball bumping), adhesive, or glass frit to the package floor 25. Likewise, additional substrate bottom components 40 can be affixed to the bottom surface of the substrate 45 within the lower cavity 20 thereby increasing the total number of components within the cavity. While described as mounted to the package floor and substrate, the use of pedestals/posts/bumps (not shown) is also within the scope of the present invention. Further description on the mounting of components on package floors pedestals/posts and on both sides of a substrate is described in commonly assigned U.S. Pat. Nos. 5,917,272 and 6,731,780 incorporated by reference herein.

In this embodiment, the substrate layer 45 is supported or suspended by the shelf 15 formed about the entire lower cavity side walls 30. The substrate 45 is adhered to the shelf 15 about the entire perimeter of the lower cavity 20 to provide a hermetic lower cavity. A conductive substrate attach material 50, such as solder, solder perform, gold, gold-gold interface (GGI), gold-tin, adhesive, or glass frit binds the substrate 45 to the shelf 15.

For certain embodiments, the shelf 15 does not need to be continuous about the entire perimeter of the lower cavity side wall 30. For example, there can be several sectional shelves 15 formed about the lower cavity side walls 30 to provide sufficient support for the substrate 45 and the substrate 45 can be affixed to these several shelves 15. Additional supports via posts or stanchions (not shown) are also within the scope of the present invention. Such a non-hermetic embodiment would provide further space within the lower cavity 20 for placement of components 35, 40. Employing only a few shelf structures 15 for adherence to the substrate 45 would generally result in a non-hermetic cavity.

In one non-hermetic embodiment the substrate 45 is suspended using clips (not shown) extending from the upper and/or lower cavity side walls 30, 65 and retaining the substrate 45 in position. A pre-assembly construction of the lid and substrate, including all components and interconnects therewith, can employ support structures extending from the lid 70 and the resulting assembled unit placed within the package 10. In such embodiments the electrical connectivity via bond wires couple the substrate to the other components 35, 40, 60.

The shelf 15, typically a material such as ceramic, can have input/output connections (I/O) or be a continuous frame with the substrate having hermetic vias for electrical connectivity and associated wirebonds and bond pads. In certain embodiments the shelf 15 is sectionalized forming a plurality of small shelf sections 15 in order to provide support for the substrate 45.

The upper cavity 55 is defined by the upper surface of the substrate 45, upper cavity side walls 65 and a covering such as a lid 70. The upper cavity 55 also has components 60 that are mounted to the upper surface of the substrate 45. The lid 70 uses a lid attach material 75 disposed on the rim 80 of the package 10 to affix the lid 70 to the package 10. The lid attach material 75 such as a seal ring, glass frit, metal for ceramic lid or direct seal lid is cladded, soldered, or sealed as known in the art. In one implementation for a hermetic upper cavity 55, the lid 70 would be tightly affixed about the rim 80.

Electrical connectivity between the components 35, 40, and 60 to the package I/O's 85 is accomplished by using vias/leads (not shown) and bond wires, wherein the vias/leads can run on or within the package material, including a multilayer package and/or substrate that has leads or traces within the layers. Other embodiments include using a pedestal (not shown) to provide connectivity from the sealed lower cavity 20 to the upper cavity 55. Shielded vias/leads can be used for RF isolation.

In one variation, both cavities 20, 55 are hermetically sealed. It is also within the scope of the invention to have only the bottom cavity 20 hermetically sealed. And, a further variation is to have both cavities 20, 55 not be hermetic.

Figure 2:
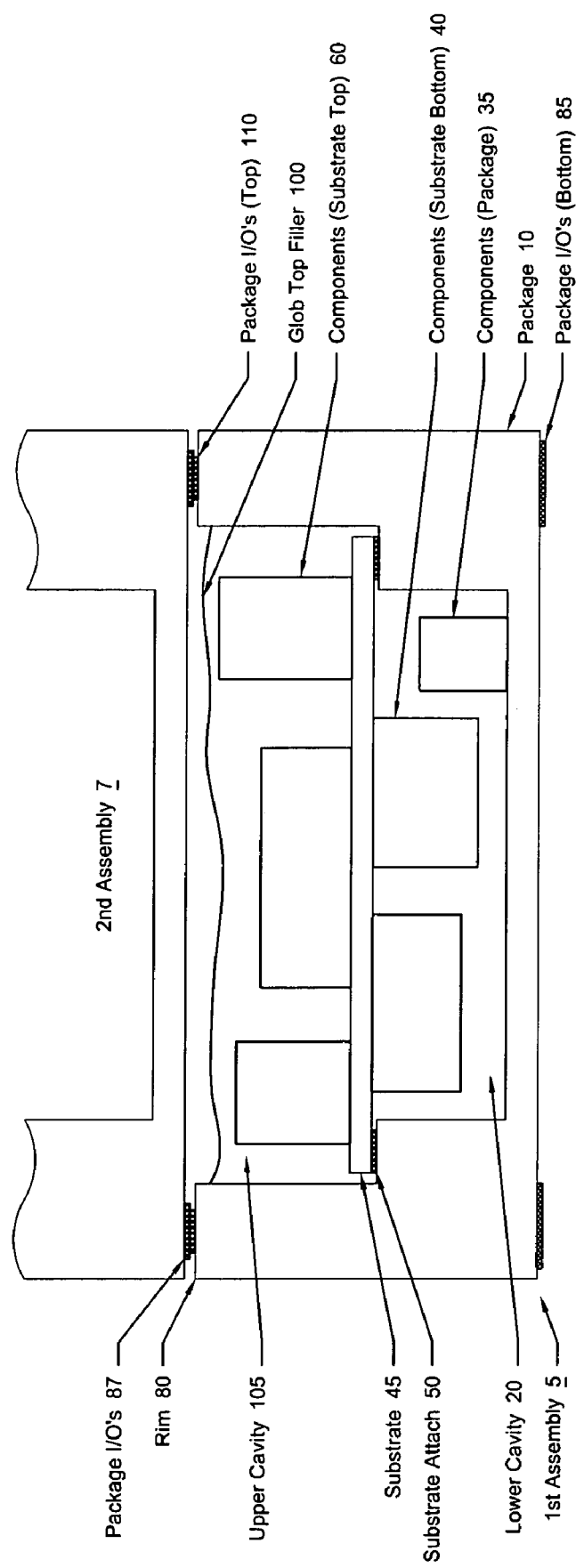
FIG. 2 a side view perspective of single hermetic cavity and a non-hermetic cavity with illustrative components wherein the substrate rests upon a package shelf and the lid is a glob top filler.

Referring to FIG. 2, the dual cavity package is depicted wherein the first or lower cavity 20 is hermetic and the second or upper cavity 105 is non-hermetic. The upper cavity 105 is sealed with a glob top filler 100 which seals the components as known in the art. The upper cavity package I/O's 110 are accessed on the rim 80 for electrical connectivity.

With top package I/O's 110 and bottom package I/O's 85 external to the package, the device can be coupled by a number of variations including stacked or piggy-backed. Stacking of an entire second assembly 7 on top of the first assembly 5 is known in the art and two or more assemblies 7, 5 can be coupled together with different functionalities in each assembly producing a new functionality in the resulting combination. In one embodiment the package I/O's 110 of the lower assembly 5 would electrically couple to the package I/O's 87 of the upper assembly 7.

Figure 3:
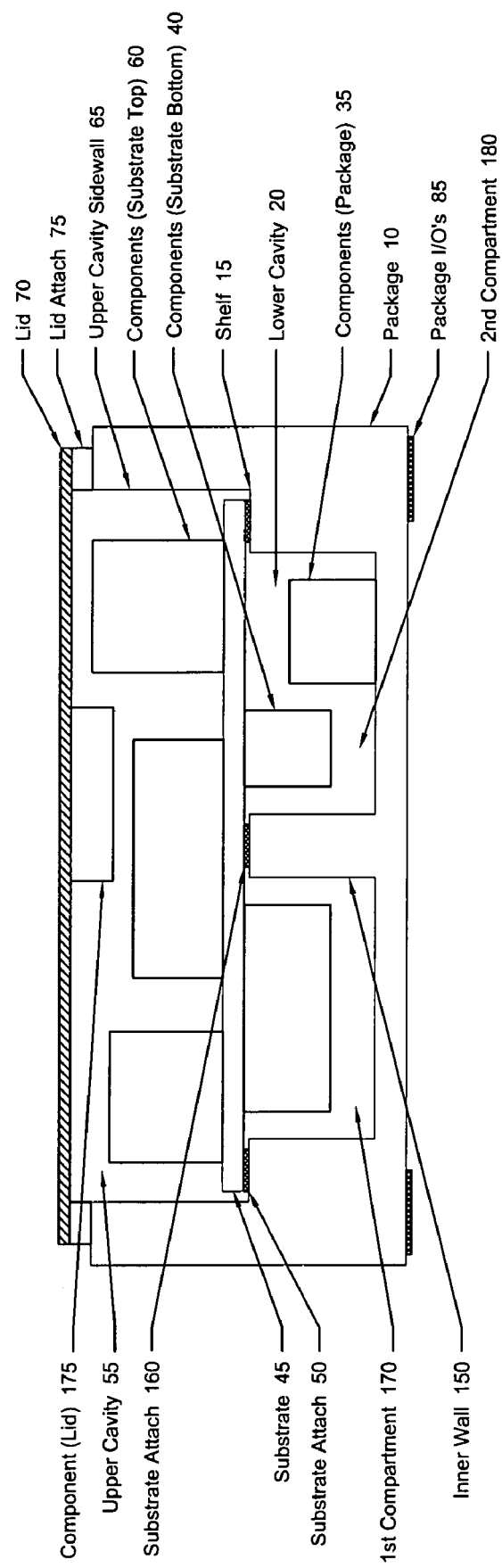
FIG. 3 is a side view perspective the dual hermetic cavities of FIG. 1, having an inner cavity wall creating internal compartments within the lower cavity, wherein all compartments and cavities are hermetic.

In FIG. 3, a further aspect of the invention is described wherein the lower cavity 20 has an inner wall 150 that extends the length of the device thereby separating the lower cavity 20 into two separate compartments 170, 180. In one embodiment, each compartment 170, 180 is separately hermetic and is well suited for RF isolation requirements. To enable the hermetic aspects, the inner wall 150 has to extend the full length of the package to fully encompass the compartment, and a substrate attach material 160 seals the inner wall 150 to the substrate 45 thereby sealing the internal compartments 170, 180. If the first and second compartment 170, 180 do not require a hermetic environment, the inner wall 150 can be sectionalized or otherwise non-contiguous and the substrate attach material 160 need not completely seal the inner wall 150 dividing the compartments 170, 180.

A further clamshell embodiment designed for ease of manufacturing provides for the substrate 45 to be coupled to the lid 70 via posts, pedestals or clips (not shown) such that the top shell encompassing the substrate components 40, 60, and lid components 175 can be assembled separate from the package 10 and then placed into the package 10. Vias/leads on the shelf 15 provide electrical connectivity of the assembled structure. And, in yet a further embodiment, the lid 70 can incorporate additional components 175 electrically coupled by bond wires and traces to conductive pathways of the package.

In one embodiment the upper cavity 55 is hermetic and sealed with a lid 70 and lid attach material 75. There are a number of variations within the scope of the present invention such as having the first compartment and second compartment hermetic; having one compartment hermetic and the other be non-hermetic, and having both compartments be non-hermetic.

Figure 4:
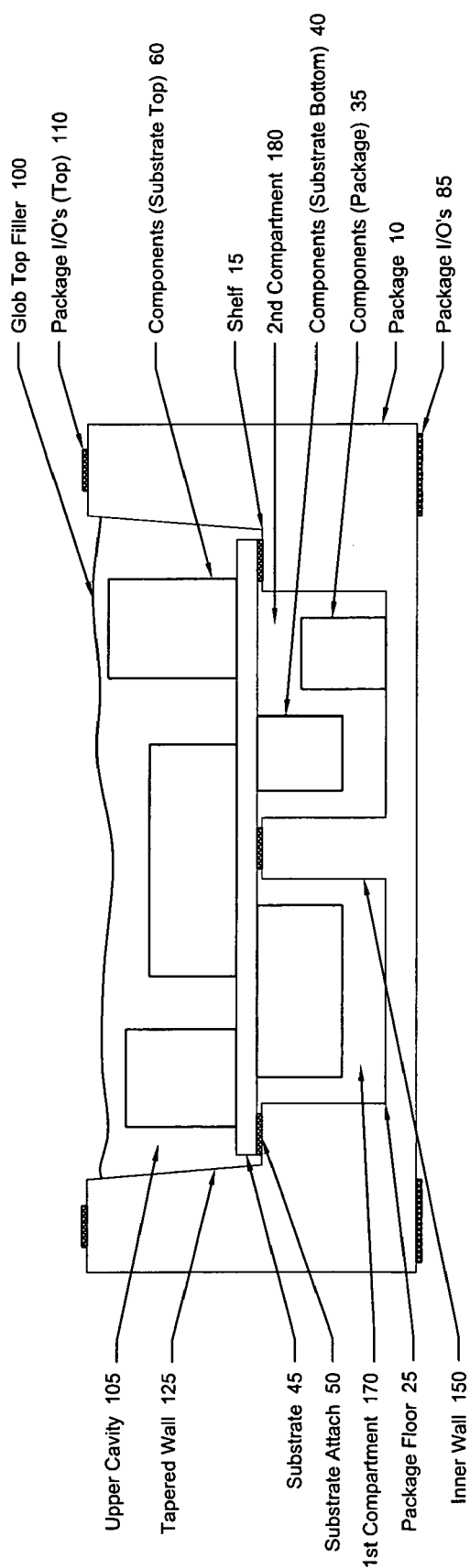
FIG. 4 is a side view perspective the dual hermetic cavities of FIG. 2, having the inner cavity wall creating internal compartments within the lower cavity, wherein all compartments and lower cavity is hermetic and the upper cavity is non-hermetic.

Referring to FIG. 4, in this variation the inner wall 150 once again divides the lower cavity 20 into two compartments 170, 180. However the upper cavity 105 is non-hermetic and sealed with a covering such as a glob top filler 100. It is also within the scope of the invention to have both cavities 170, 180 be non-hermetic, or a combination thereof. As is known in the art, isolating the internal cavities can reduce cross-contamination and provide further isolation. The cavity wall(s) 150 are used to create various internal cavities in different sizes and shapes and can be all the same material but may also be a hermetic pedestal or drop in walls. The drop in walls in the hermetic environment can use an attachment material on the package floor 25 as well as the substrate 45.

While the dimensions of the present invention are not a limiting aspect, some approximate dimensions are useful in terms of visualization. A representative typical dual cavity package with an exterior dimension about 5 mm wide by 1.8 mm high may have an inner upper cavity width of about 3.47 mm, an inner lower cavity width of about 1.95 mm, with a shelf dimension of about 0.76 mm. Other typical packages common in the frequency control industry include 14 mm×9 mm×3 mm; and 5 mm×3.2 mm×1 mm.

By appropriately selecting the dimensions of the substrate and the package the present invention allows for a self-aligning feature. For example, by having a low tolerance dimension between the substrate 45 and the tapered upper cavity side walls 125, the substrate 45 can be placed onto the shelves and automatically be aligned with respect to the bond pads. This self-aligning feature is particularly useful in a manufacturing environment and can be further facilitated by employing slanted upper cavity side walls 125 that guide the substrate 45 into place and can also employ guides or keying to position the substrate 45 into position for electrical connectivity. The self-aligning feature is facilitated by tapering or slanting the upper cavity side walls 125 to thereby direct the substrate into the appropriate position.

Figure 5:
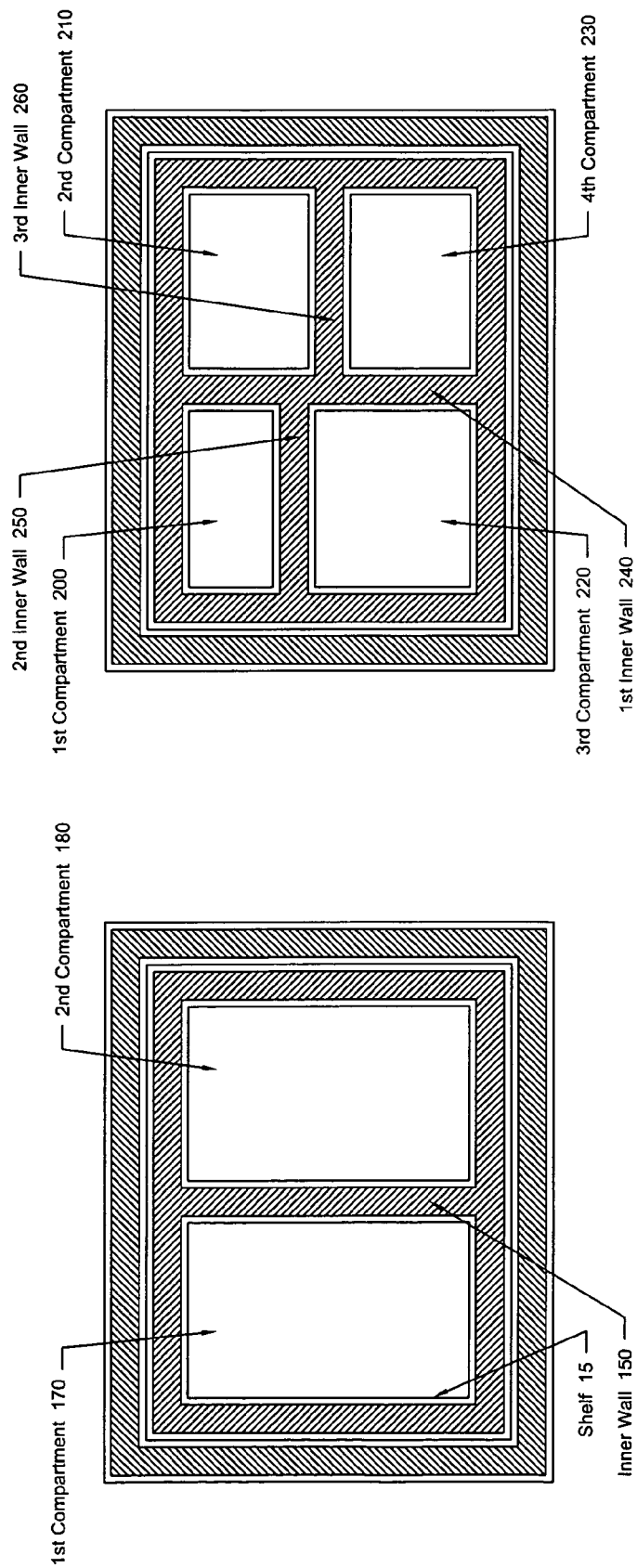
FIG. 5a is a top view perspective of the dual cavity package with internal compartments showing the lower compartment having two approximately equal-sized compartments.
FIG. 5b is a top view perspective of the dual cavity package with internal compartments showing the lower compartment having four mixed-sized compartments.

FIG. 5a and FIG. 5b are top view perspectives illustrating the compartmentalization of the lower cavity 20 with the upper cavity elements removed. In FIG. 5a, the first compartment 170 and the second compartment 180 are shown as being approximately equal in size and separated by an inner wall 150 that separates the cavities.

FIG. 5b shows a plurality of inner walls 240, 250, 260 that form a number of internal compartments 200, 210, 220, 230. As shown, the inner walls can be offset or irregular to form different size cavities depending upon the desired application. It is within the scope of the invention to have any combination of hermetic cavities/compartments depending upon the desired application. And, the use of the compartments permits separation and isolation of components. In one embodiment the inner walls are drop in assemblies thereby facilitating the manufacturability. It should be readily appreciated that the compartmentalization applies to some or all the cavities within the assembly.

Figure 6:
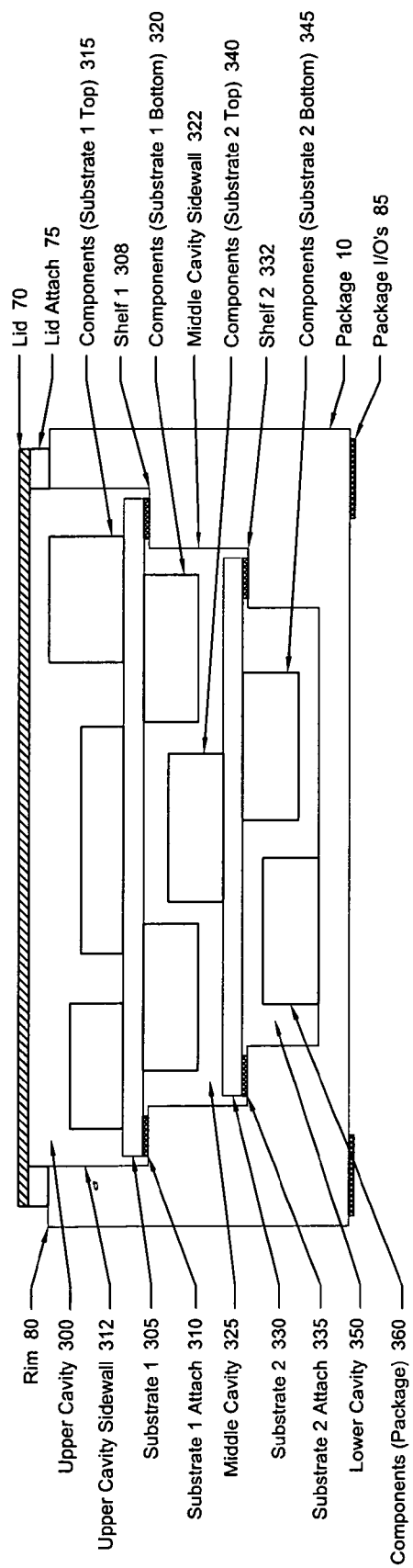
FIG. 6 is a side view perspective of a triple cavity hermetic package having a lower cavity covered by a first substrate, a middle cavity covered by a second substrate, and a lid forming the third cavity, wherein the substrates are suspended by package shelves.

A further variation of the invention is shown in FIG. 6 which shows a multiple layered implementation creating a number of cavities. The first or upper cavity 300 is defined by the lid 70, first cavity side walls 312 and the first substrate 305. The lid is attached to the rim 80 by a lid attach material 75. The first substrate 305 is supported by the first shelf 308 and attached to the shelf 308 by the first substrate attach material 310. A number of components 315 are attached to the top surface of the first substrate 305 and other components 320 are attached to the bottom surface of the first substrate 305.

Figure 7:
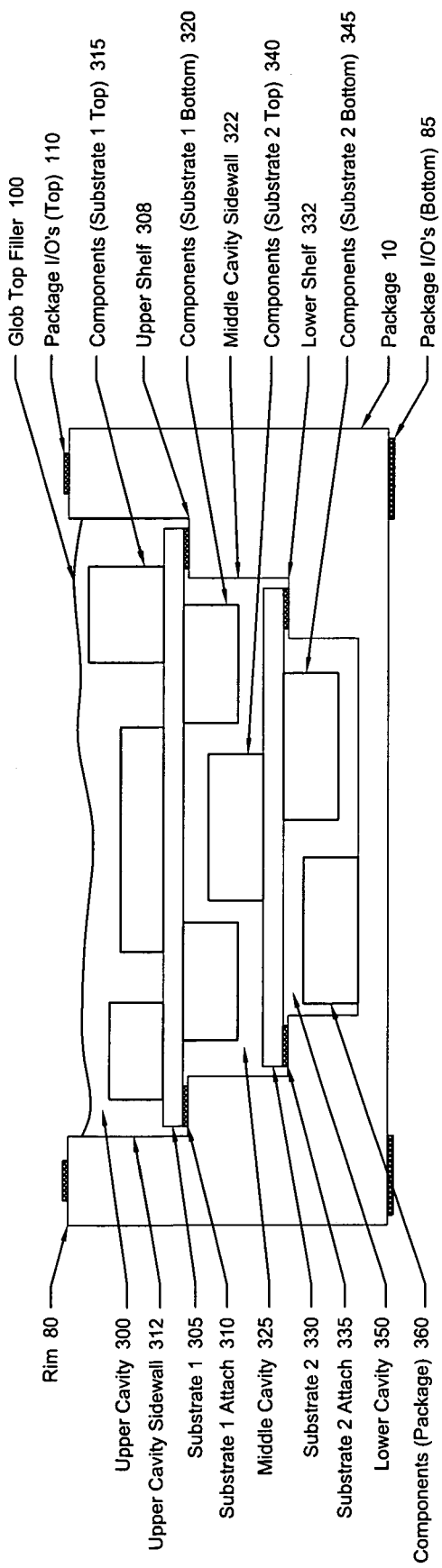
FIG. 7 is a side view perspective of a triple cavity hermetic/non-hermetic package having a lower cavity covered by a first substrate forming a hermetic cavity, a middle cavity covered by a second substrate forming a hermetic cavity, and glob top filler covering the package and forming the non-hermetic third cavity, wherein the substrates are suspended by package shelves.

The second or middle cavity 325 is defined by the second cavity side walls 322, and the first and second substrates 305, 330 respectively. The second substrate 330 is supported by the second shelf 332 and affixed with the second substrate attach material 335. There are components 340 attached to the top surface of the second substrate 330 and components 345 attached to the bottom surface of the second substrate 330. There are additional components 360 attached to the floor of the package 10. Thus a large number of components can be installed within the device and can be separated to take advantage of the hermetic properties and isolate those devices that may interfere or cause problems with other components. FIG. 7 illustrates the multi-cavity structure as shown in FIG. 6, but having a glob top filler 100 with top package I/O 110.

Figure 8:
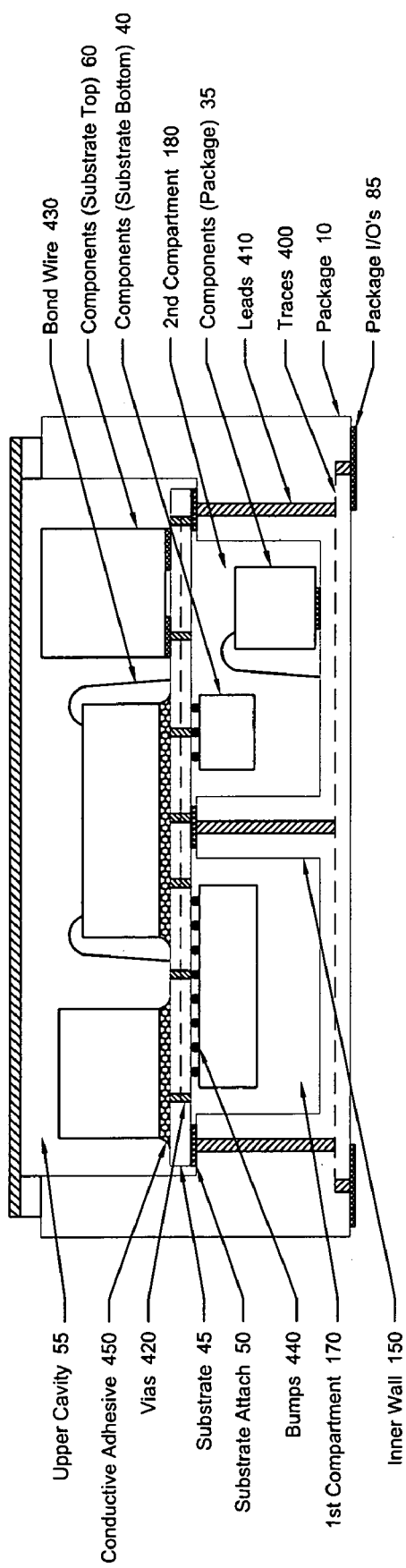
FIG. 8 is a side view perspective of FIG. 3 showing some of the electrical connectivity implementations that couple the components to the external environment.

Some of the electrical connectivity options are illustrated in FIG. 8. The package I/O 85 is the interface to the external environment and should therefore be accessible to the internal components scattered within the package 10. The package I/O 85 is on the underside of the package 10 and coupled to electrical leads or pathways 400, 410 that travel throughout the package, including isolated electrical leads that couple to components requiring isolation from other electrical signals.

The package electrical leads or vias 410, 420 are typically metallized pathways within the package and inner walls. There can also be electrical traces 400 on the surfaces of the package and also traces in underlying layers in multilayered packages. The pathways 400, 410, 420 can include cofired vias within the ceramic package, inner walls, and also can include plated filled via holes or half-holes (such as edge castellations), holes/half-holes as well as wire bonds. The substrate 45 connectivity similarly can employ vias 420 and traces 400 on the top surface or bottom surface of the substrate 45, and in multi-layered substrates, the electrical pathways can also be within the substrate.

In one embodiment the components 35, 40, 60 use bump bonded vias 440 with gold bumps (or conductive adhesive bumps or a layer of anisotropically conductive adhesive) 450 in order to electrically couple the components to the electrical pathways 400, 410, 420. They can also be coupled by bond wires 430 depending upon the individual component and the design. The pathways 400, 410 can be coupled to the substrate 45 and have leads along or within the substrate 45. Vias 420 within the substrate allow the electrical coupling between surface traces of the substrate as well as electrical traces in the multilayered substrate. In the flip chip interconnect application for the components located on the bottom surface of the substrate, there is no need to make mirror image interconnects on the top surface.

In this embodiment the inner wall 150 is fabricated as part of the package 10, however variations include drop-in inner walls (not shown) or pedestals (not shown) to provide separate compartments particularly for non-hermetic compartments.

While there are known difficulties in establishing sidewall metallization, additional components can be mounted to the side walls of the package, inner wall and even pedestals to accommodate additional components or design constraints. One of the advantages of the present invention is that it allows for thin film substrates, flex circuits, or others to employ the characteristics desired based on the ability to pattern features with different dielectric constants. The thin film substrates also allow inductors to be incorporated on to the surfaces of each layer. Inductors can be created as spirals on single layer substrates or helical structures on multilayer substrates.

The cavities can employ a layered approach with multiple substrates to form multiple cavities (hermetic or non-hermetic) and can also incorporate multiple compartments within the cavities (hermetic or non-hermetic). Electrical connectivity such as vias connects the cavities and thereby couples the electronic components requiring connectivity.

Applications for the present invention include telecommunications, frequency control, sensors, and homeland defense. For example, the present invention allows for improvements in sensors, such as acoustic or resistivity sensors by minimizing thermal gradients by placing sensors in close proximity to each other and sealing one sensor and leaving the other exposed for sensing. In this manner the exposed sensor can be compared to the isolated sensor and analyzed for differences in parameters such as frequency, resistance, and phase.

In one embodiment the multi-cavity and multi-compartment is constructed by a technique such as:
1) Forming a package with a first and second shelf and an inner wall extending from the package floor;
2) Screen on solder (e.g. lead-free, gold-tin eutectic, or otherwise) onto bottom surface of first substrate, wherein the solder forms substrate attachment;
3) Attach bottom side components and possibly top-side components to first substrate, such as an ASIC that is flip-chipped to the bottom surface and capacitors on top surface;
4) Place first substrate onto first shelf in package and reflow solder;
5) Attach devices to top surface, such as SAW devices, that can be connected by wire bonds down or flip chip stud bumps. These connections include incorporating impedance matching components such as spiral inductors;
6) Attach first cavity substrate to form hermetic first cavity; and
7) Attach lid to package to form second cavity.

The present invention is capable of many variations and applications utilizing the inventive elements described herein. For example, a number of devices can be 'piggybacked' or stacked one on top of the other and electrically coupled to provide modular and scalar electronics. The I/O from the lower device can be brought out on the top surface of the lower device in order to couple to the I/O on the bottom of the upper device. Multiple devices can be stacked thereby allowing additional circuitry and functionality to be implemented Other variations include the use of adhesives such as anisotropically conductive or isotropically conductive adhesives to attach the elements.

A further variation of the present invention is a multi-cavity (stacked 3D cavities) ceramic package and can be a leaded, leadless, hermetic, non-hermetic (or combination of hermetic and non-hermetic). The package has characteristics of thin-film substrates, but with low-cost co-fired ceramic packages. The assembled package can be used to monolithically integrate fine-line components, e.g. inductors on the thin-film substrate.

There are many variations and flexibility in the design of the present invention. For example, the teachings of the present invention allow creation of a three-dimensional (3D) package with thick film materials, thin film materials, and flex materials. Thus, it is possible to have mixed thin film applications with low cost ceramic hermetic packaging.

An application for the present invention includes creating at least two internal cavities by attaching a suspended substrate comprised of thin film, thick film or flex circuit technologies onto package shelves. There can be at least one hermetic internal cavity created using hermetic vias and gold/tin hermetic seal rings, and possibly with a glob-topped upper chamber.

Another application includes separate hermetic adjacent or stacked cavities to isolate cavities for RF suppression and/or cleanliness reasons. In certain applications the present invention does not require flip chipping as all the components are initially accessible from one surface and is thus single sided. And, the present invention can have multiple hermetic cavities/compartments and can use a thin film substrate for better RF performance.

The detailed embodiment described herein and illustrated in the figures should not be construed as in any way limiting. The description of certain embodiments of the invention has been presented for the purposes of illustration and description. The invention is susceptible of many variations, all within the scope of the specification, figures. It is not intended to be exhaustive or to limit the invention to the precise form disclosed. Many modifications and variations are possible in light of this disclosure. It is intended that the scope of the invention be limited not by this detailed description, but rather by the claims appended hereto.

What is claimed is:

1. A multiple cavity structure, comprising:
    a package housing comprising a package floor and package sides, said package sides extending about said package floor, wherein said package sides form a first shelf extending about a periphery of an inner surface of the package sides;
    a planar substrate coupled to said shelf forming a first cavity between said package floor and said substrate, wherein said substrate has at least one substrate component on at least one surface of said substrate;
    a covering on said package housing, wherein said covering forms a second cavity between said covering and said substrate; and
    at least one via proximate said shelf and electrically coupling said substrate.

2. The structure according to claim 1, wherein said package housing is ceramic.

3. The structure according to claim 1, wherein said substrate is selected from at least one of the group consisting of: thick film, thin film, and flex film.

4. The structure according to claim 1, wherein said covering is a lid adhered to a rim of said package sides.

5. The structure according to claim 1, wherein said covering is glob top filler.

6. The structure according to claim 1, wherein said first cavity is hermetic.

7. The structure according to claim 1, wherein said first and second cavity are hermetic.

8. The structure according to claim 1, wherein said substrate is secured to said shelf by a conductive substrate attach material.

9. The structure according to claim 1, further comprising at least one package component mounted to a surface selected from the group consisting of: package floor, interior covering surface, and side walls.

10. The structure according to claim 9, wherein substrate components and said package component are electrically coupled by at least one electrical coupler from the group consisting of: wire bonds, vias, through-holes, and traces.

11. A multiple compartment, multiple cavity package, comprising:
    a package housing forming an open-top enclosure comprising, a package floor and, package sides about said package floor, wherein said package sides form a first shelf extending about a periphery of an inner surface of the package sides;
    a first substantially planar substrate coupled about said first shelf and forming a first cavity between said package floor and said first substrate; and
    at least one inner wall approximately orthogonal to said package floor coupled to said package sides and to said substrate, wherein said at least one inner wall forms at least two compartments in said first cavity.

12. The package according to claim 11, wherein at least one of said compartments is hermetic.

13. The package according to claim 11, further comprising at least one component coupled on at least once surface of said substrate, wherein said component is monolithically integrated.

14. The package according to claim 11, further comprising vias proximate said shelf and electrically coupling said substrate.

15. The package according to claim 11, wherein said first cavity is hermetic.

16. The package according to claim 11, further comprising a covering on said open-top enclosure, wherein said covering forms a second cavity between said covering and said substrate.

17. The package according to claim 11, further comprising a second shelf formed about the periphery of the inner surface of the package sides and being approximately parallel to said first shelf and disposed between said covering and said first shelf, wherein a second substrate is coupled to said second shelf forming a third cavity between said exposed top portion and said second substrate, and wherein said second cavity is disposed between said first and second substrate.

18. The package according to claim 16, further comprising at least one package component mounted to a surface selected from the group consisting of: package floor, interior covering surface, and side walls.

19. The package according to claim 11, wherein substrate components and said package component are electrically coupled by at least one electrical coupler from the group consisting of: wire bonds, vias, through-holes, and traces.

20. The package according to claim 11, wherein said at least one inner wall is a drop-in.

* * * * *